(12) United States Patent
Kimura

(10) Patent No.: US 8,384,137 B2
(45) Date of Patent: Feb. 26, 2013

(54) SEMICONDUCTOR DEVICE

(75) Inventor: Hideki Kimura, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 15 days.

(21) Appl. No.: 13/187,954

(22) Filed: Jul. 21, 2011

(65) Prior Publication Data

US 2011/0272748 A1 Nov. 10, 2011

(30) Foreign Application Priority Data

Feb. 23, 2010 (JP) ................................. 2010-037297
Sep. 8, 2010 (JP) ................................. 2010-201047

(51) Int. Cl.
*H01L 29/808* (2006.01)

(52) U.S. Cl. ................................. 257/279; 257/E29.312

(58) Field of Classification Search .................. 257/279; *H01L 29/48, 21/338, 29/812*
See application file for complete search history.

(56) References Cited

FOREIGN PATENT DOCUMENTS

| JP | 58-147164 A | 9/1983 |
|---|---|---|
| JP | 63-38264 | 2/1988 |
| JP | 63-305544 | 12/1988 |
| JP | 2-103963 A | 4/1990 |
| JP | 3-29328 | 2/1991 |
| JP | 4-45547 | 2/1992 |
| JP | 8-45966 | 2/1996 |
| JP | 8-78437 | 3/1996 |
| JP | 10-242166 A | 9/1998 |
| JP | 11-103072 | 4/1999 |
| JP | 2001-274415 | 10/2001 |

OTHER PUBLICATIONS

Office Action issued Aug. 14, 2012, in Japanese Patent Application No. 2010-201047 with English translation.
Japanese Office Action issued Apr. 24, 2012 in Patent Application No. 2010-037297 with English Translation.

*Primary Examiner* — Jarrett Stark
*Assistant Examiner* — Lawrence Tynes, Jr.
(74) *Attorney, Agent, or Firm* — Oblon, Spivak, McClelland, Maier & Neustadt, L.L.P.

(57) ABSTRACT

A semiconductor device includes: a gate electrode, a source electrode and a drain electrode, all of which are provided on top of a first surface of a substrate, and each of which includes multiple fingers; and an ohmic electrode layer. The semiconductor device includes: a gate terminal electrode connecting the fingers of the gate electrode together; a source terminal electrode connecting the fingers of the source electrode together; a drain terminal electrode connecting the fingers of the drain electrode together; and a gate pad placed on top of the ohmic electrode layer, and connecting the ohmic electrode layer to the gate terminal electrode. The semiconductor device further includes: an n type semiconductor layer formed in the substrate; a p type semiconductor layer formed in the n type semiconductor layer; and a reaction layer formed in the interface between the p type semiconductor layer substrate and the ohmic electrode layer.

7 Claims, 6 Drawing Sheets

SEMICONDUCTOR DEVICE

CROSS-REFERENCE TO RELATED APPLICATION(S)

This application is based upon and claims the benefit of priority from the prior Japanese Patent Application No. 2010-201047, filed on Sep. 8, 2010, and is based upon the prior Japanese Patent Application No. 2010-037297, filed on Feb. 23, 2010, the entire contents of which are incorporated herein by reference.

FIELD

Embodiments of the invention relate to a semiconductor device.

BACKGROUND

Field effect transistors (FETs) using gallium arsenide (GaAs) have been widely put into practical use as semiconductor devices which have excellent high-frequency characteristics and which operate in micrometer/millimeter/submillimeter wavebands.

A conventional semiconductor device, for example, includes: a substrate; a gate electrode, a source electrode and a drain electrode, each of which includes multiple fingers and is provided on top of the substrate; a gate terminal electrode which is provided on top of the substrate and gathers all the fingers of the gate electrode; a source terminal electrode which is provided on top of the substrate and gathers all the fingers of the source electrode; and a drain terminal electrode which is provided on top of the substrate and gathers all the fingers of the drain electrode. The semiconductor device further includes: a backside metal electrode which is formed on the backside surface of the substrate; a through-hole which is formed in the substrate and connects the source terminal electrode to the backside metal electrode.

A semiconductor device that has a through-hole and a method of manufacturing the semiconductor device are known, for example, by JP, PH08-78437A.

In general, an FET and matching circuits to help the FET to achieve better performance are incorporated together in a package. The matching circuits are connected to both the gate electrode and the drain electrode of the FET by wire bonding using gold wires.

Aluminum (Al) is conventionally used for gate pads. Aluminum, however, exhibits poor adhesion to a GaAs substrate. In addition, an increase in a bonding force needed to bond gold wires causes a problem that the gate pad comes off the substrate.

Accordingly, an ohmic metal electrode is provided under the gate pad. The ohmic metal electrode reacts with the GaAs substrate to thus increase the adhesion of the ohmic metal electrode to the GaAs substrate.

When a negative voltage is applied to the gate electrode with the voltage of the backside metal electrode set at 0 V, an electric current flows between the ohmic metal electrode and the backside metal electrode through the substrate. In other words, an electric current flows between the gate electrode and the backside metal electrode. The flow of the electric current impairs the performance of the FET.

DETAILED DESCRIPTION

Embodiment 1

According to the embodiment, a semiconductor device includes: a semi-insulating GaAs substrate; an n type semiconductor layer formed in the semi-insulating GaAs substrate; a p type semiconductor layer formed in the n type semiconductor layer; an ohmic electrode layer formed on top of the p type semiconductor layer; a reaction layer formed in an interface between the ohmic electrode layer and the p type semiconductor layer; a gate electrode placed on top of a first surface of the semi-insulating GaAs substrate, and including a plurality of fingers; a source electrode placed on top of the first surface of the semi-insulating GaAs substrate, and including a plurality of fingers; a drain electrode placed on top of the first surface of the semi-insulating. GaAs substrate, and including a plurality of fingers; a gate terminal electrode placed on top of the first surface of the semi-insulating GaAs substrate, and gathering together the fingers of the gate electrode; a source terminal electrode placed on top of the first surface of the semi-insulating GaAs substrate, and gathering together the fingers of the source electrode; a drain terminal electrode placed on top of the first surface of the semi-insulating GaAs substrate, and gathering together the fingers of the drain electrode; a gate pad placed on top of the ohmic electrode layer, and connecting the ohmic electrode layer and the gate terminal electrode together; and a backside metal electrode placed on top of a second surface of the semi-insulating GaAs substrate opposite to the first surface, and connected to the source terminal electrode.

Figure 1:
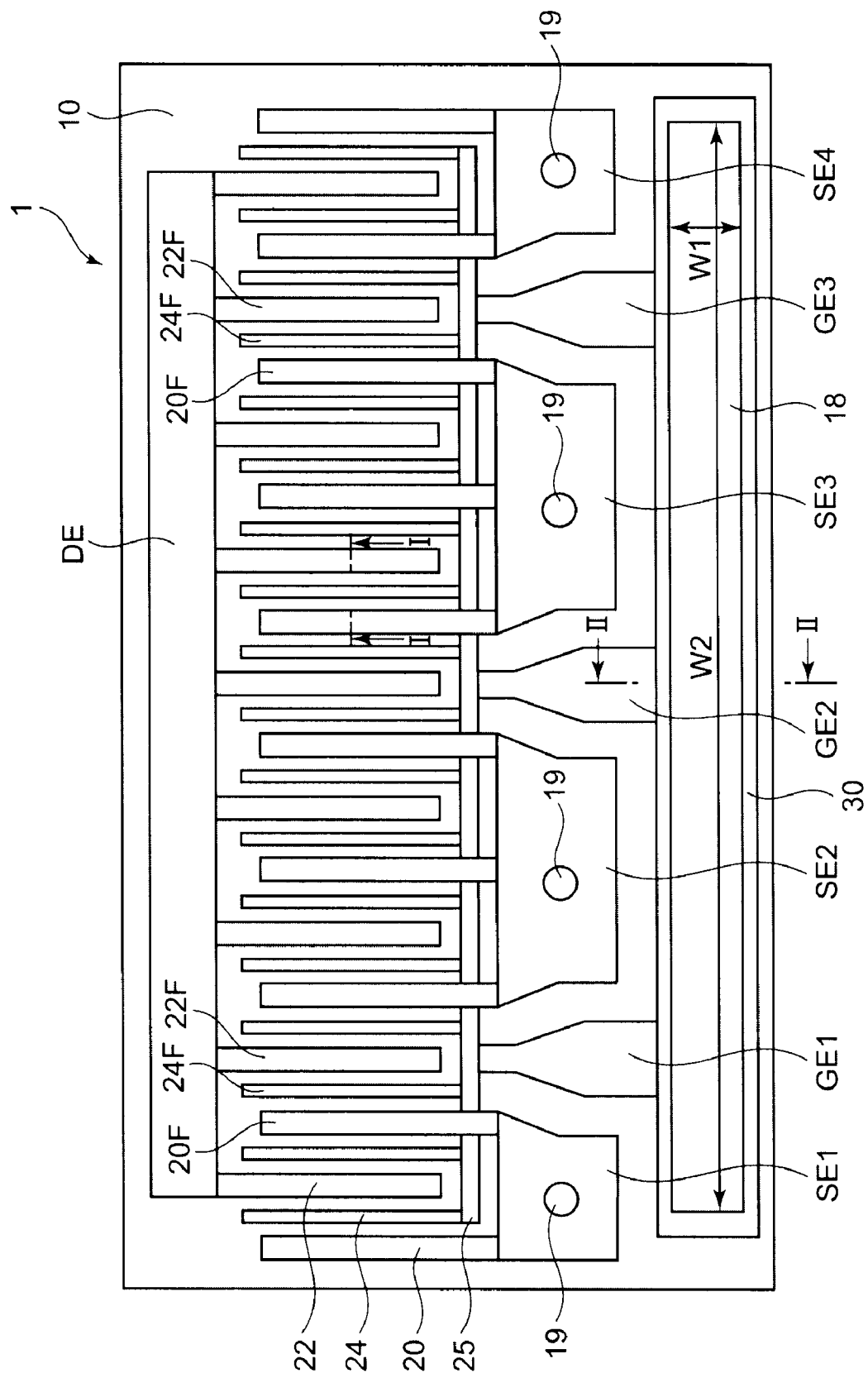
FIG. 1 is a top view of a semiconductor device of Embodiment 1.
Figure 2:
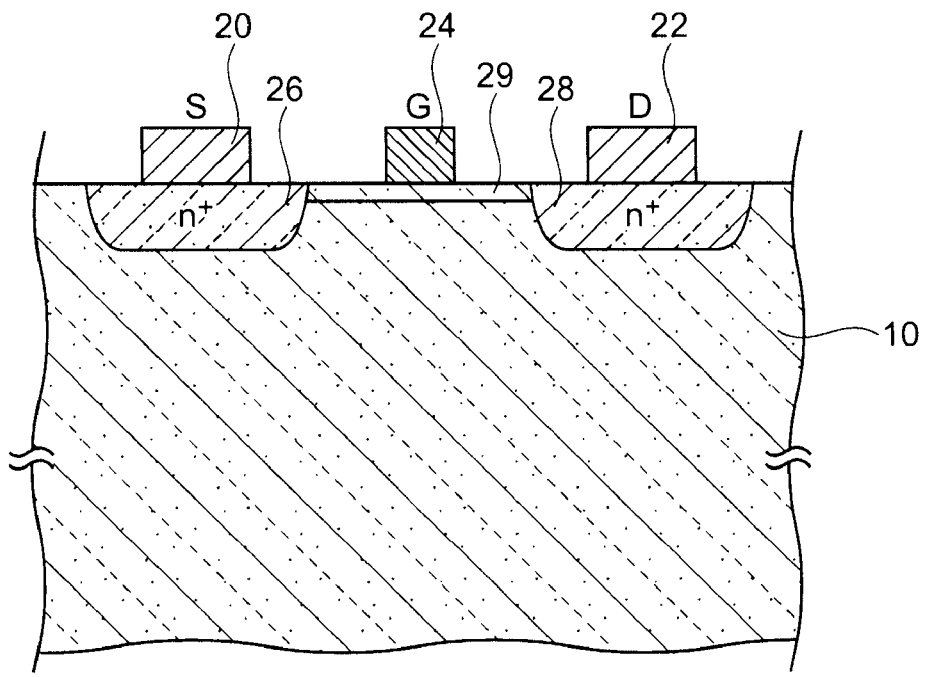
FIG. 2 is a cross-sectional view of the semiconductor device taken along the line I-I of FIG. 1.
Figure 3:
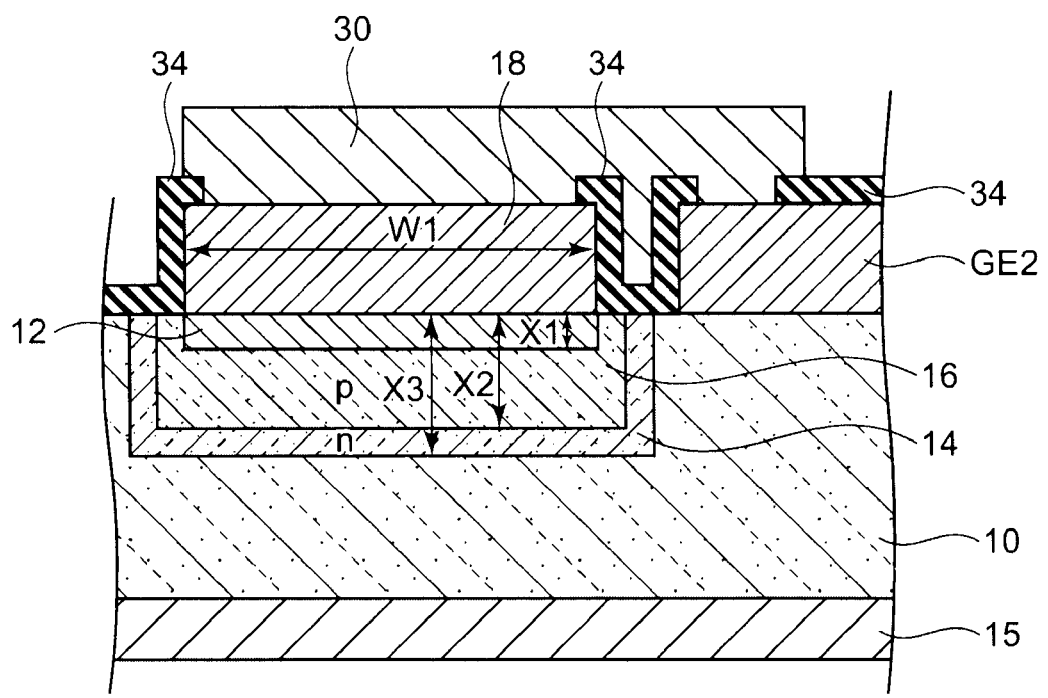
FIG. 3 is a cross-sectional view of the semiconductor device taken along the line II-II of FIG. 1.

FIG. 1 is a top view of a semiconductor device of this embodiment. FIG. 2 is a cross-sectional view of the semiconductor device taken along the line I-I of FIG. 1. FIG. 3 is a cross-sectional view of the semiconductor device taken along the line II-II of FIG. 1.

As FIGS. 1, 2, and 3 show, a semiconductor device 1 includes: a semi-insulating GaAs substrate 10; a source electrode 20, a drain electrode 22 and a gate electrode 24, all of which are provided on top of a first principal surface of the semi-insulating GaAs substrate 10; and an ohmic electrode layer 18. The source electrode 20 has multiple fingers 20F; the drain electrode 22 has multiple fingers 22F; and the gate electrode 24 has multiple fingers 24F.

The semiconductor device 1 further includes source terminal electrodes SE1 to SE4, a drain terminal electrode DE, and gate terminal electrodes GE1 to GE3. All of these terminal electrodes are provided on top of the semi-insulating GaAs substrate 10. Each of the source terminal electrodes SE1 to SE4 is connected to and gathers together some of the multiple fingers 20F of the source electrode 20. The drain terminal electrode DE is connected to and gathers together the multiple fingers 22F of the drain electrode 22. The gate terminal electrodes GE1 to GE3 share a gate bus line 25. The gate bus line 25 is connected to and gathers together the multiple fingers 24F of the gate electrode 24. Thereby, the gate terminal electrodes GE1 to GE3 are connected to and gather together the fingers 24F of the gate electrode 24.

The semiconductor device 1 further includes: the ohmic electrode layer 18 which is provided on top of the semi-insulating GaAs substrate 10; and a gate pad 30 which is provided on top of the ohmic electrode layer 18. The gate pad 30 connects the ohmic electrode layer 18 to the gate terminal electrodes GE1 to GE3.

The drain terminal electrode DE and the source terminal electrodes SE1 to SE4 are placed in a way that the drain terminal electrode DE is opposed to all the source terminal electrodes SE1 to SE4 across a region in which the fingers 20F of the source electrodes 20, the fingers 22F of the drain electrodes 22 and the fingers 24F of the gate electrodes 24 are provided. All the gate terminal electrodes GE1 to GE3 are placed on the same side as are the source terminal electrodes SE1 to SE4.

A region where the semiconductor device is formed will be described by referring to FIG. 2. The semi-insulating GaAs substrate 10 includes a source region 26 and a drain region 28, which are formed, for example, by implantation of silicon (Si) ions. The source electrode 20 is provided on top of the source region 26 while the drain electrode 22 is provided on top of the drain region 28. The gate electrode 24 is provided on top of the semi-insulating GaAs substrate 10 between the source region 26 and the drain region 28. The source electrode 20, the drain electrode 22 and the gate electrode 24 shown in FIG. 2 respectively represent one of the fingers of the source electrode 20, one of the fingers of the drain electrode 22 and one of the fingers of the gate electrodes 24, which are shown in FIG. 1.

A Schottky contact is formed in the interface between the semi-insulating GaAs substrate 10 and the gate electrode 24. In addition, in a surface area of the semi-insulating GaAs substrate 10 between the source region 26 and the drain region 28, a channel 29 is formed, for example, by a technique of implanting Si ions or a similar technique. FIG. 2 shows the configuration of a metal semiconductor field effect transistor (MESFET). Note that the backside surface of the semi-insulating GaAs substrate 10 and its vicinities are omitted from FIG. 2.

FIG. 3 shows a cross-sectional view of the semiconductor device 1 taken along the line II-II line of FIG. 1. An n type semiconductor layer 14 is formed in the semi-insulating GaAs substrate 10. In addition, a p type semiconductor layer 16 is formed in the n type semiconductor layer 14. The undersurface and the side surfaces of the p type semiconductor layer 16 are covered with the n type semiconductor layer 14. Furthermore, a reaction layer 12 is formed in the p type semiconductor layer 16. The undersurface and the side surfaces of the reaction layer 12 are covered with the p type semiconductor layer 16.

The ohmic electrode layer 18 is formed on top of the reaction layer 12. On top of the semi-insulating GaAs substrate 10, the gate terminal electrode GE2 is formed next to the ohmic electrode layer 18. The gate pad 30, which is connected to the gate terminal electrode GE2, is provided on top of the ohmic electrode layer 18.

The n type semiconductor layer 14 is formed by implanting ion species into the semi-insulating GaAs substrate 10 in accordance with the ion implantation technique or a similar technique. The p type semiconductor layer 16, on the other hand, is formed by implanting ion species into the n type semiconductor layer 14 in accordance with the ion implantation technique or a similar technique. Note that the sequence in which the n type semiconductor layer 14 and the p type semiconductor layer 16 are formed is not limited to this.

Silicon (Si), for example, may be used as the ion species for forming the n type semiconductor layer 14. Carbon (C) or beryllium (Be) may be used as the ion species for forming the p type semiconductor layer 16.

The n type semiconductor layer 14 and the p type semiconductor layer 16 together form a pn junction.

The reaction layer 12 is formed on top of the semi-insulating GaAs substrate 10 (the p type semiconductor layer 16) during an alloying process to form the ohmic electrode layer 18. When the ohmic electrode layer 18 is made, for example, of AuGe/Pt, the alloying process is done by heat treatment at several hundreds of degrees centigrade. In this alloying process, an ohmic alloy layer that is to be the reaction layer 12 is formed by the reaction of GaAs and AuGe.

The ohmic electrode layer 18 allows a bonding force, with which the bonding wires are bonded to the gate pad 30, to be increased.

The gate pad 30 is made, for example, of Ti/Pt/Au.

An insulating layer 34 is formed on the first principal surface of the semi-insulating GaAs substrate 10. The gate electrode 24, the source electrode 20, the drain electrode 22, the gate terminal electrodes GE1 to GE3, the source terminal electrodes SE1 to SE4, the drain terminal electrode DE and the ohmic electrode layer 18 on the first principal surface are insulated from one another by the insulating layer 34. For example, a silicon nitride film or a silicon oxide film is used as the insulating layer 34.

A backside metal electrode 15 is formed on a second principal surface of the semi-insulating GaAs substrate 10, which is opposed to the first principal surface of the semi-insulating GaAs substrate 10. The backside metal electrode 15, for example, includes: a barrier metal layer; and a metal layer for the grounding purpose, which is provided on the barrier metal layer. The barrier metal layer is made, for example, of a Ti layer, a Ti/W layer, or a Ti/Pt layer. The metal layer for the grounding purpose is made, for example, of a Au layer.

The backside metal electrode 15 is made, for example, of a Ti/Au material. In addition, the backside metal electrode 15 has a thickness of, for example, approximately 5 μm to 30 μm. In addition, the backside metal electrode 15 is connected to the source terminal electrodes SE1 to SE4 by through-holes 19, which is formed penetrating the semi-insulating GaAs substrate 10.

Each of the source electrode 20 and the drain electrode 22 is made, for example, of a AuGe/Pt material.

The gate electrode 24 is made, for example, of Ti/Al.

Note that longitudinal pattern lengths respectively of the gate electrode 24, the source electrode 20 and the drain electrode 22 are set up in a way that their longitudinal patter lengths become shorter as an operating frequency of the semiconductor device becomes higher such as from a micrometer wave to a millimeter wave, and then to a submillimeter wave. For example, the pattern lengths range from approximately 25 μm to 50 μm for the millimeter wave band.

The source electrode 20 has a width, for example, of approximately 10 μm. Each of the source terminal electrodes SE1 to SE4 has a width, for example, of approximately 100 μm. The width of each of the gate terminal electrodes GE1 to GE3 is approximately 5 μm in the connection portion between the gate bus line and each of the gate terminal electrodes GE1 to GE3.

The ohmic electrode layer 18 has a width WI, for example, of approximately 100 μm, whereas the length W2 of the ohmic electrode layer 18 ranges, for example, from approximately 100 μm to 3 mm.

In the semiconductor device of this embodiment, a portion of the semi-insulating GaAs substrate 10, which is located between the gate pad 30 and the backside metal electrode 15, includes: the n type semiconductor layer 14 formed in the semi-insulating GaAs substrate 10; the p type semiconductor layer 16 formed in the n type semiconductor layer 14; and the reaction layer 12 formed in the p type semiconductor layer 16. Hence, a metal (30, 18)-reaction layer (12)-p type semiconductor layer (16)-n type semiconductor layer (14) structure is formed, and the pn junction is formed from the p type semiconductor layer 16 and the n type semiconductor layer 14.

When a negative voltage is applied to the gate pad 30 with the voltage of each source terminal electrode SE set at 0 V, a reverse voltage is applied to the pn junction formed from the p type semiconductor layer 16 and the n type semiconductor layer 14. In this event, a potential barrier is formed by the n type semiconductor layer 14 and the p type semiconductor layer 16 becomes large, whereas the potential barrier formed by the reaction layer 12 and the p type semiconductor layer 16 holds its height. The leakage current flowing between the gate electrode 24 (gate pad 30) and the backside metal electrode 15 is inhibited. Accordingly the semiconductor device 1 of this embodiment can thus keep its high performance. In addition, the ohmic electrode layer 18 helps improve the bonding strength.

In this respect, the reaction layer 12 has a depth X1, for example, of approximately 0.1 μm. The p type semiconductor layer 16 has a junction depth X2, for example, of approximately 0.2 μm. The n type semiconductor layer 14 has a junction depth X3, for example, of approximately 0.3 μm.

As has been described thus far, in the semiconductor device 1 of this embodiment, the potential barrier is formed by the pn junction, which is formed from the p type semiconductor layer 16 and the n type semiconductor layer 14. This inhibits the leakage current which would otherwise flow between the gate pad 30 and the backside metal electrode 15. In addition, in the semiconductor device 1 of this embodiment, the ohmic electrode layer 1 improves the bonding strength. Consequently, a high-performance and reliable semiconductor device can be provided by the embodiment.

Comparative Example

Figure 4:
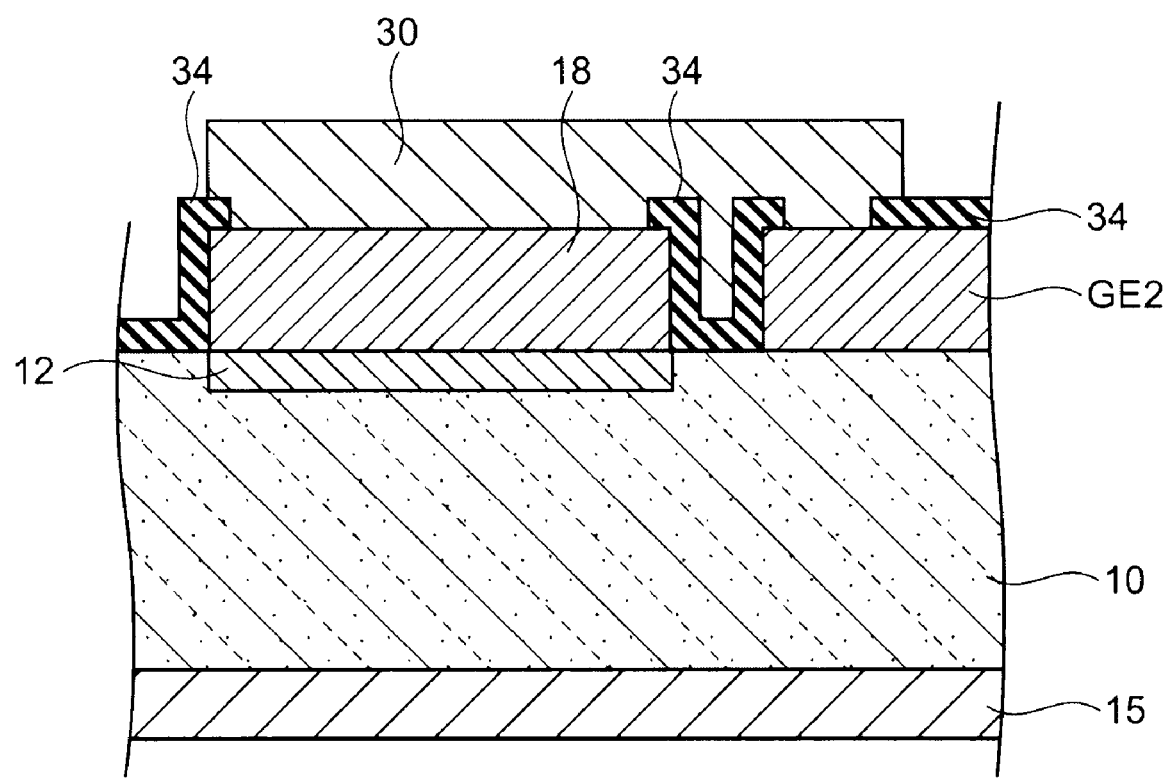
FIG. 4 is a cross-sectional view of a semiconductor device of a comparative example.

FIG. 4 is a cross-sectional view of a semiconductor device of a comparative example. FIG. 4 shows a portion which is similar to that shown in FIG. 3. The semiconductor device of the comparative example has neither the p type semiconductor layer 16 nor the n type semiconductor layer 14 under the reaction layer 12. To put it differently, the semiconductor device of the comparative example has neither the p type semiconductor layer 16 covering the reaction layer 12 nor the n type semiconductor layer 14 covering the p type semiconductor layer 16. Accordingly, a low Schottky barrier is formed between the ohmic electrode layer 18 and the semiconductor substrate 10. The Schottky barrier is lower than the potential barrier of the pn junction. In addition, when a negative voltage is applied to the gate pad 30 with the voltage of each source terminal electrode SE set at 0V, a reverse bias leakage current flows between the metal (30, 18) and the backside metal electrode 15 via the substrate 10. Accordingly, it is difficult for the semiconductor device of the comparative example to achieve higher performance.

Embodiment 2

Descriptions will be provided for a semiconductor device of another embodiment that prevents the leakage current between the gate electrode and the backside metal electrode. The semiconductor device of this embodiment is provided with multiple divided gate terminal electrodes that are connected to one another by a resistive layer. In the semiconductor device of this embodiment, loop oscillation is inhibited by the resistive layer. This embodiment prevents the leakage current between the gate electrodes (the resistive layer) and the backside metal electrode, which occurs due to the resistive layer.

According to the second embodiment, a semiconductor device includes: a semi-insulating GaAs substrate; a gate electrode placed on top of a first surface of the semi-insulating GaAs substrate, and including a plurality of fingers; a source electrode placed on top of the first surface of the semi-insulating GaAs substrate, and including a plurality of fingers; a drain electrode placed on top of the first surface of the semi-insulating GaAs substrate, and including a plurality of fingers; a plurality of gate bus lines placed on top of the first surface of the semi-insulating GaAs substrate, each gate bus line gathering together the corresponding ones of the fingers of the gate electrode; a source terminal electrode placed on top of the first surface of the semi-insulating GaAs substrate, and gathering together the fingers of the source electrode; a drain terminal electrode placed on top of the first surface of the semi-insulating GaAs substrate, and gathering together the fingers of the drain electrode; a plurality of gate terminals connected to the plurality of gate bus lines, respectively; a plurality of extraction electrodes formed between adjacent ones of the gate terminals, each extraction electrode being adjacent to the corresponding one of the gate terminal; a plurality of gate pads each covering the corresponding gate terminal and the extraction electrode adjacent to the corresponding gate terminal, and connecting the gate terminal to the extraction electrode; an n type semiconductor resistive layer formed in the semi-insulating GaAs substrate and being in contact with adjacent paired ones of the extraction electrodes; a p type semiconductor layer formed in the semi-insulating GaAs substrate and covering a circumference of the resistive layer including an undersurface of the resistive layer; an n type semiconductor layer formed in the semi-insulating GaAs substrate and covering a circumference of the p type semiconductor layer including an undersurface of the p type semiconductor layer; and a backside metal electrode formed on the backside of the semi-insulating GaAs substrate, and electrically connected to a connection portion of the source electrode.

A semiconductor device of Embodiment 2 will be described in detail below by referring to the drawings.

Figure 5:
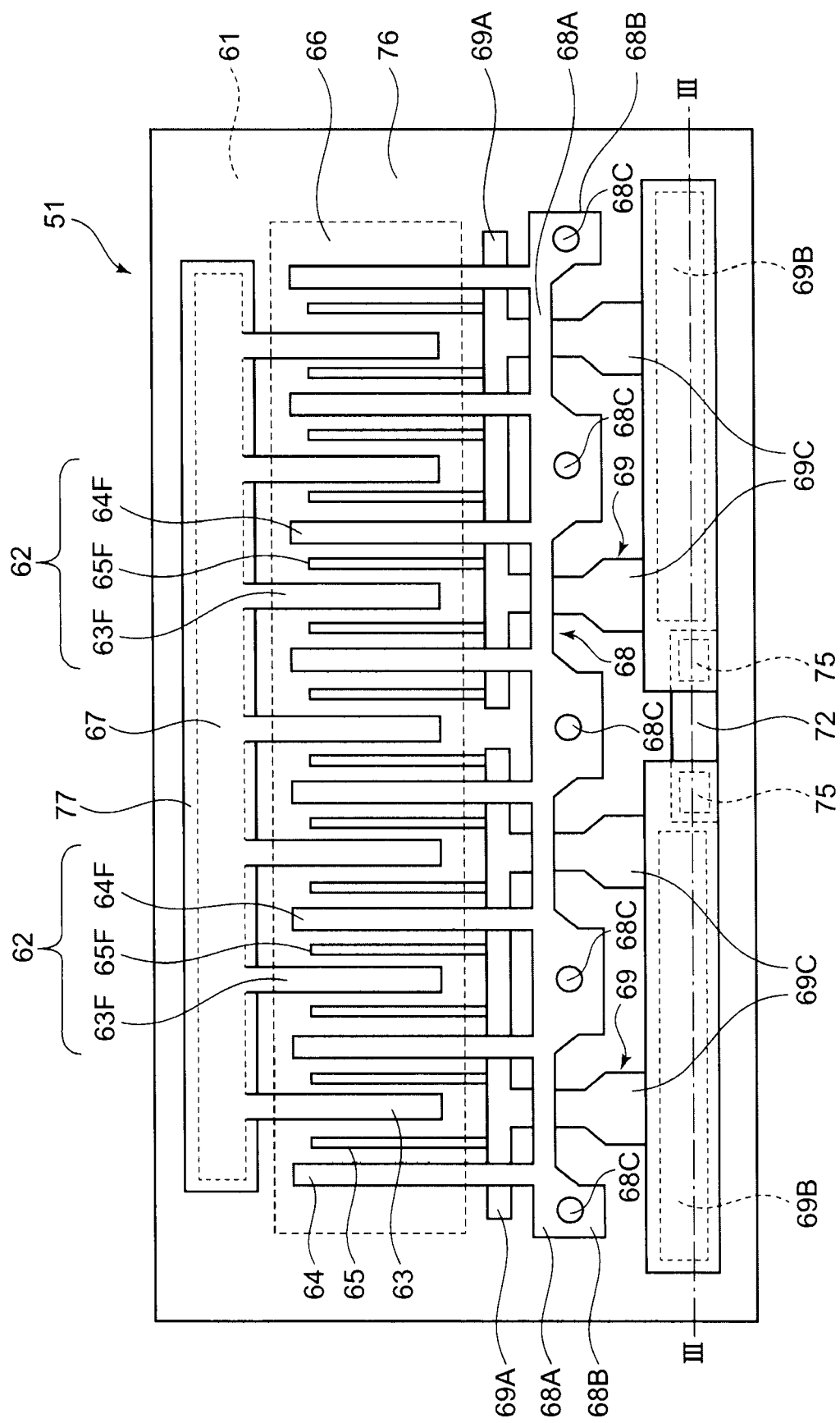
FIG. 5 is a top view of a semiconductor device of Embodiment 2.

FIG. 5 is a top view of the semiconductor device of Embodiment 2. As shown in FIG. 5, a semiconductor device 51 includes: a semi-insulating GaAs substrate 61; a drain electrode 63, a source electrode 64 and a gate electrode 65 placed on a first principal surface of the semi-insulating GaAs substrate 61. The drain electrode 63 has multiple fingers 63F; the source electrode 64 has multiple fingers 64F; and the gate electrode 65 has multiple fingers 65F. The fingers 65F of the gate electrode 65 are placed between the fingers 63F of the drain electrode 63 and the fingers 64F of the source electrode 64.

A microscopic FET 62 is formed by each finger 65F of the gate electrode 65 together with one finger 63F of the drain electrode 63, which is placed on a side of the above-mentioned finger 65F, and one finger 64F of the source electrode 64, which is placed on the other side of the above-mentioned finger 65F. In the following description, a term "device region 66" is used to mention a region where the fingers of the drain electrode 63, the source electrode, 64 and the gate electrode 65 are placed and multiple FETs 62 are formed. In addition, a backside metal electrode 60 (not shown in FIG. 5) made of a Ti/Au layer is formed on the backside surface of the semi-insulating GaAs substrate 61.

The semiconductor device 51 includes a drain terminal electrode 67, a source terminal electrode 68, and a gate terminal electrode 69, all of which are provided on top of the semi-insulating GaAs substrate 61. The multiple fingers 63F of the drain electrode 63 are connected to and are gathered together by the drain terminal electrode 67. The multiple fingers 64F of the source electrode 64 are connected to and are gathered together by the source terminal electrode 68. The multiple fingers 65F of the gate electrode 65 are connected to and are gathered together by the gate terminal electrode 69.

The source terminal electrode 68 includes: a source bus line 68A connected to the fingers 64F of the source electrode 64; and source terminals 68B. The gate terminal electrode 69 includes: gate bus lines 69A connected to the fingers 64F of the gate electrode 64; gate terminals 69B; and extraction lines 69C that connect the gate bus lines 69A to the gate terminals 69B.

The drain terminal electrode 67 is made of the same material as is the drain electrode 63. In addition, the drain terminal electrode 67 is formed integrally with the drain electrode 63. Likewise, the source terminal electrode 68 is made of the same material as is the source electrode 64. In addition, the source terminal electrode 68 is formed integrally with the source electrode 64. The gate terminal electrode 69 is made of the same material as is the gate electrode 65. In addition, the gate terminal electrode 69 is formed integrally with the gate electrode 65.

Each of the drain electrode 63 and the source electrode 64 is made, for example, of an ohmic metal obtained by stacking a layer of AuGe and a layer of Pt in this order. In addition, the gate electrode 65 is made, for example, of a Schottky metal obtained by stacking a layer of Al and a layer of Ti in this order. Note that the gate electrode 65 may also be a Schottky metal obtained by stacking a layer of Ti, a layer of Al and a layer of Ti in this order. In a case where an insulating film (not illustrated) is formed on the gate electrode 65 if a layer uppermost in the gate electrode 65 is formed from a Ti layer, the adhesion between the gate electrode 65 and the insulating film is improved.

The drain terminal electrode 67, the source terminal electrode 68 and the gate terminal electrode 69 are formed on top of the semi-insulating substrate 61, but outside the device region 66. The drain terminal electrode 67 is formed extending in the longitudinal direction of the device region 66. In addition, the source bus line 68A is formed extending in the longitudinal direction of the device region 66, in a location opposed to the drain terminal electrode 67 across the device region 66. Furthermore, the gate bus lines 69A are formed between the source bus line 68A and the device region 66, extending in the longitudinal direction of the device region 66. The gate terminals 69B are formed extending in the longitudinal direction of the device region 66, in locations opposed to their corresponding gate bus lines 69A across the source bus line 68A. In addition, the multiple extraction lines 69C are formed between the gate bus lines 69A and the gate terminals 69B, extending in a direction perpendicular to their longitudinal direction. The extraction lines 69C electrically connect the gate bus lines 69A to their corresponding gate terminals 69B.

Note that the source electrode 64 is electrically insulated from the gate bus lines 69A at their intersections. Likewise, the source bus line 68A is electrically insulated from the extraction lines 69C at their intersections. To be more specific, the source electrode 64 is formed over the gate bus lines 69A, for example, as in the form of "an air bridge." Alternatively, the source electrode 64 is formed over the gate bus lines 69A with insulators provided in between. The source bus line 68A is formed over the extraction lines 69C as in the form of a "bridge in the air," or with insulators provided in between.

The multiple divided gate bus lines 69A and the multiple divided gate terminals 69B are provided there. The number of divided gate terminals 69B is determined depending on a combination of the frequency of the RF signal that is inputted into the semiconductor device 51, the gate width, a matching circuit, etc. FIG. 5 show the case where two gate bus lines 69A and two gate terminals 69B are provided there. In a case where, for example, a RF signal of 10 GHz is inputted into the semiconductor device 51 where a total of 100 to 200 microscopic FETs 62 are formed, the number of divided gate bus lines 69A and the number of divided gate terminals 69B each range from approximately 4 to 32.

Figure 6:
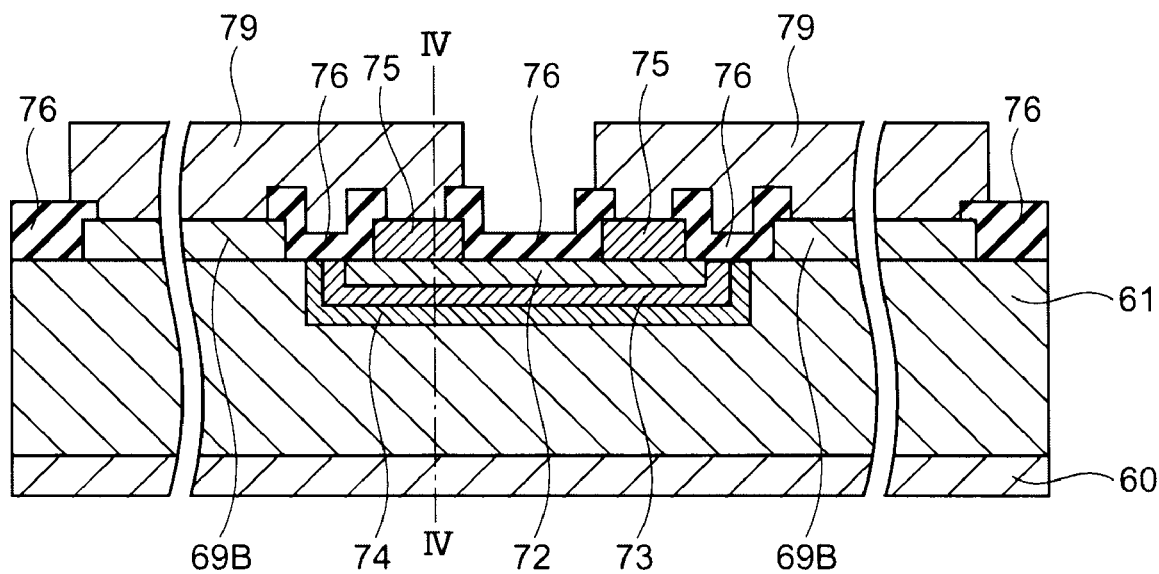
FIG. 6 is a cross-sectional view of the semiconductor device taken along the line III-III of FIG. 5.

Descriptions will be given of an area in which two divided gate terminals 69B are provided by referring to FIG. 6. FIG. 6 is a cross-sectional view of the semiconductor device taken along the line III-III of FIG. 5. As FIG. 6 shows, in an area located between every two adjacent ones of the multiple divided gate terminals 69B, a band-shaped resistive layer 72 is formed in a surface area of the semi-insulating GaAs substrate 61. For example, n type impurities are diffused in the resistive layer 72 in a relatively high concentration. In addition, a p type semiconductor layer 73 is formed in the semi-insulating GaAs substrate 61 in a way that: the p type semiconductor layer 73 covers the undersurface and the side surfaces of the resistive layer 72; and some portions of the p type semiconductor layer 73 are exposed to the outside from the semi-insulating GaAs substrate 61. In addition, an n type semiconductor layer 74 is formed in the semi-insulating GaAs substrate 61 in a way that the n type semiconductor layer 74 covers the undersurface and the side surfaces of the p type semiconductor layer 73; and some portions of the n type semiconductor layer 74 are exposed to the outside from the semi-insulating GaAs substrate 61. To put it differently, the n type semiconductor layer 73 is formed in the semi-insulating GaAs substrate 61, the p type semiconductor layer 73 is formed in the n type semiconductor layer 74, and the resistive layer 72 is formed in the p type semiconductor layer 73.

Figure 7:
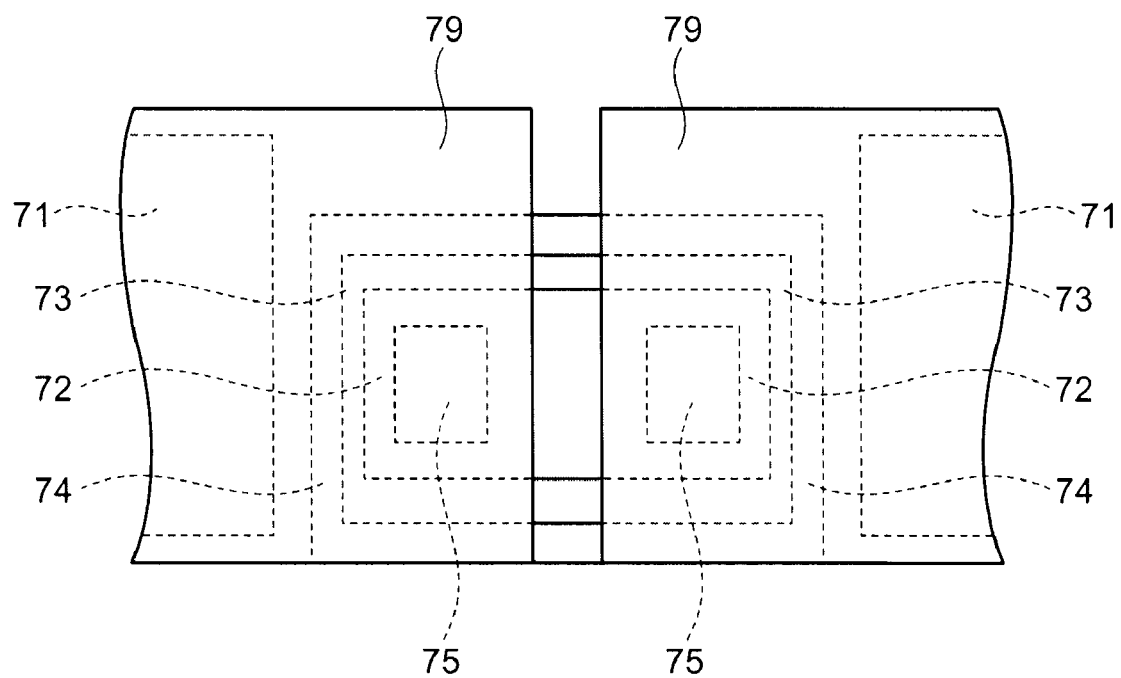
FIG. 7 is a top view illustrating a part of FIG. 5 in an enlarged manner.

FIG. 7 is an enlarged top view showing a portion of FIG. 5 for describing in more detail the p type semiconductor layer 73 and the n type semiconductor layer 74. The p type semiconductor layer 73 is formed in a way that the p type semiconductor layer 73 surrounds and covers the resistive layer 72 whereas the n type semiconductor layer 74 is formed in a way that the n type semiconductor layer 74 surrounds and covers the p type semiconductor layer 73.

The resistive layer 72, the p type semiconductor layer 73 and the n type semiconductor layer 74 are formed, for example, in order starting with the n type semiconductor layer 74, the p type semiconductor layer 73 in the middle, and ending with the resistive layer 72 by doping predetermined portions of the semi-insulating GaAs substrate 61 with ions of their corresponding substances, respectively. However, the sequence in which the resistive layer 72, the p type semiconductor layer 73, and the n type semiconductor layer 74 are formed does not have to be the above-mentioned one. The impurity concentration of the n type semiconductor layer 74 and the impurity concentration of the p type semiconductor layer 73 are determined as follows. In a case where the n type semiconductor layer 74 and the p type semiconductor layer 73 have their respective predetermined impurity concentrations, when a negative voltage is applied to the gate pad 79 with the voltage of the backside metal electrode 60 set at 0 V, a potential barrier is formed between the n type semiconductor layer 74 and the p type semiconductor layer 73, as well as a voltage appearing between the n type semiconductor layer 74 and the p type semiconductor layer 73 becomes larger than a voltage appearing between the resistive layer 72 and the p type semiconductor layer 73. For example, most of the applied voltage appears between the n type semiconductor layer 74 and the p type semiconductor layer 73.

As FIG. 6 shows, extraction electrodes 75 are formed on top of the resistive layer 72 formed in the above-described way. The extraction electrodes 75 are made of an ohmic metal that is ohmic to the resistive layer 72. In addition, a protection film 76 is formed on top of the semi-insulating GaAs substrate 61. As FIG. 5 shows, the protection film 76 has openings that allow the drain terminal electrode 67, the gate terminals 69B, and the extraction electrodes 75 to be exposed to the outside therefrom. The protection film 76 is made, for example, of silicon nitride (SiN) film or silicon oxide ($SiO_2$) film, and has a thickness, for example, of approximately 200 nm. Electrode pads 77, 79 are formed in the opening portions of the protection film 76. To be more specific, a drain pad 77 is formed on top of the drain terminal electrode 67 whereas gate pads 79 are formed on top of the gate terminals 69B.

Through-holes 68C that penetrate the semi-insulating GaAs substrate 11 electrically connect the source terminals 68B to the backside metal electrode 60.

As FIG. 6 shows, each gate pad 79 formed on the corresponding gate terminal 69B is formed in a way that the gate pad 79 further extends over the extraction electrode 75 that is adjacent to the gate terminal 69B. Accordingly, each gate pad 79 electrically connects the corresponding gate terminal 69B to the adjacent extraction electrode 75. Hence, every two adjacent divided gate terminals 69B are electrically connected by the resistive layer 72.

Concerning how to manufacture the semiconductor device, each component may be formed by a commonly-known method. No specific restriction is imposed on either the method of or the sequence of manufacturing each component.

Figure 8:
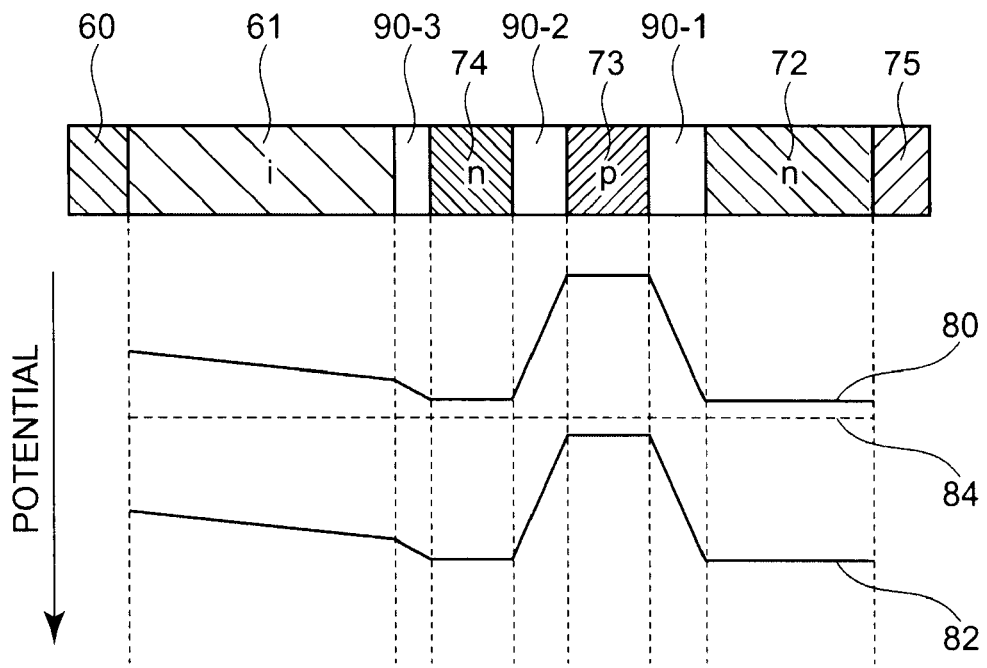
FIG. 8 is a diagram illustrating both a cross section of the semiconductor device taken along the line IV-IV of FIG. 6 and the potential formed by the cross section.

Potentials generated by the layers 72, 73, 74 will be described next. Description of the potentials starts with a case where no voltage is applied between the gate pad 79 and the backside metal electrode 60. FIG. 8 shows the relationship between a cross section of the semiconductor device taken along the line IV-IV of FIG. 6 and the potentials generated by the cross section. FIG. 8 shows a portion of the cross section in the form of a band. Note that a solid line 80 represents the conduction band, a solid line 82 represents the valence band, and a dashed line 84 represents the Fermi level.

As FIG. 8 shows, the potential generated by the p type semiconductor layer 73 is shallower than each of the potentials generated respectively by the resistive layer 72 and by the n type semiconductor layer 74. In addition, the potential generated by the semi-insulating GaAs substrate 61 has a slope, which becomes shallower toward the backside metal electrode 60, between the n type semiconductor layer 74 and the backside metal electrode 60. Note that, in FIG. 8, reference numerals 90-1, 90-2, 90-3 denote depletion layers.

Figure 9:
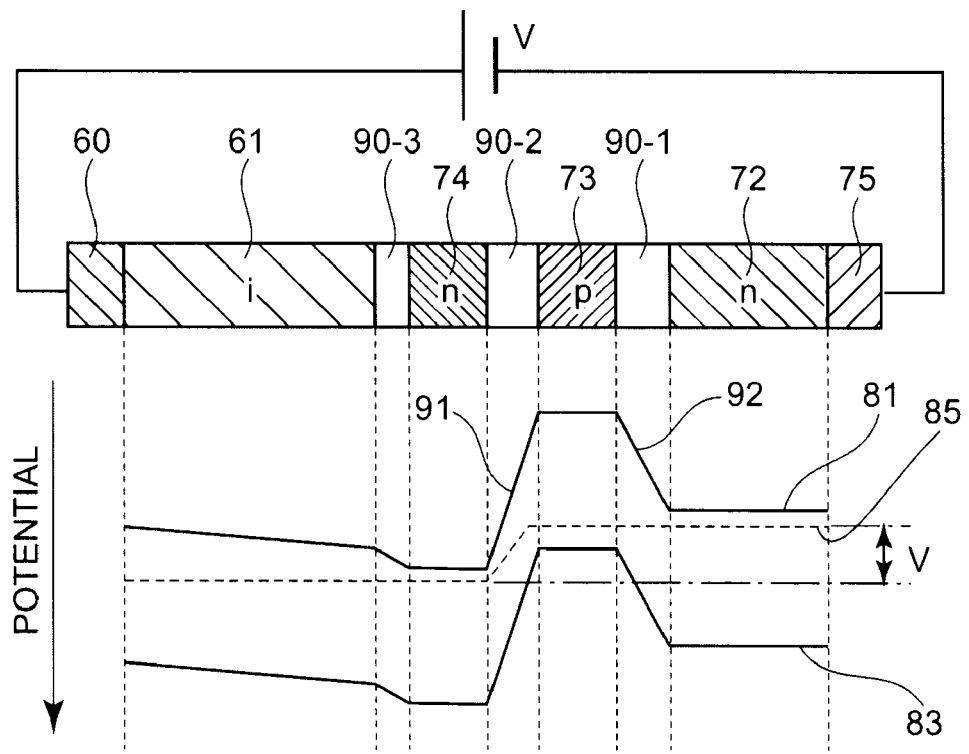
FIG. 9 is another diagram illustrating both the cross section of the semiconductor device taken along the line IV-IV of FIG. 6 and the potential formed by the cross section.

Next, description will be provided for a case where a negative voltage is applied to the gate pad 79 with the voltage of the backside metal electrode 60 set at 0 V. FIG. 9 shows the potentials generated by the layers 72, 73, 74. A solid line 81 represents the conduction band, a solid line 83 represents the valence band, and a dashed line 85 represents the Fermi level.

When a negative voltage is applied to the gate pad 79 with the voltage of the backside metal electrode 60 set at 0 V, the voltage appearing between the n type semiconductor layer and the p type semiconductor layer becomes higher than the voltage appearing between the resistive layer and the p type semiconductor layer, as well as a potential barrier is formed between the n type semiconductor layer and the p type semiconductor layer. Accordingly, the potential of the n type semiconductor layer 74 becomes deeper than the potential of the p type semiconductor layer 73. In this event, a potential barrier 91 between the n type semiconductor layer 74 and the p type semiconductor layer 73 becomes large, whereas a potential barrier 92 between the reaction layer 72 and the p type semiconductor layer 73 holds its height.

As has been described thus far, in the semiconductor device 51 of this embodiment, the p type semiconductor layer 73 is formed around the resistive layer 72 whereas the n type semiconductor layer 74 is formed around the p type semiconductor layer 73. Accordingly, even if a negative voltage is applied to the gate pad 79 with the potential of the backside metal electrode 60 set at 0 V, the potential barrier 91 between the n type semiconductor layer 74 and the p type semiconductor layer 73 becomes large, whereas the potential barrier 92 between the reaction layer 72 and the p type semiconductor layer 73 holds its height. Hence, even if a negative voltage is applied to the gate pad 79 with the voltage of the backside metal electrode 60 set at 0V, the leakage current that flows between the gate terminals 69B and the backside metal electrode 60 via the resistive layer 72 can be reduced.

In the semiconductor device of Embodiment 2, the p type semiconductor layer and the n type semiconductor layer are formed around a resistive layer located between the multiple divided gate electrode terminal portions. Accordingly, the semiconductor device of Embodiment 2 can prevent the leakage current from flowing between the gate terminals and the backside metal electrode via the resistive layer.

The semiconductor devices of the embodiments reduce the leakage current. Accordingly, the semi-insulating GaAs substrate 61 may be formed thinner. As a consequence, the heat generated by the FETs 62 can be dissipated efficiently, so that the semiconductor device can improve its heat-dissipation performance.

In addition, some errors in the manufacturing processes may form the backside metal electrode 60 on a side surface of the semi-insulating substrate 61. Even in this case, it is possible to inhibit the occurrence of the leakage current between the gate terminal electrode 69 and the backside metal electrode 60 formed on a side surface of the semi-insulating GaAs substrate 61.

As has been described thus far, the semiconductor devices of the embodiments are capable of preventing a leakage current from flowing between the electrode (gate electrode pad, resistive layer) in the vicinity of the gate terminal electrode and the backside metal electrode.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor device comprising:
   a semi-insulating GaAs substrate;
   an n type semiconductor layer formed in the semi-insulating GaAs substrate;
   a p type semiconductor layer formed in the n type semiconductor layer;
   an ohmic electrode layer formed on top of the p type semiconductor layer;
   a reaction layer formed in an interface between the ohmic electrode layer and the p type semiconductor layer;
   a gate electrode placed on top of a first surface of the semi-insulating GaAs substrate, and including a plurality of fingers;
   a source electrode placed on top of the first surface of the semi-insulating GaAs substrate, and including a plurality of fingers;
   a drain electrode placed on top of the first surface of the semi-insulating GaAs substrate, and including a plurality of fingers;
   a gate terminal electrode placed on top of the first surface of the semi-insulating GaAs substrate, and gathering together the fingers of the gate electrode;
   a source terminal electrode placed on top of the first surface of the semi-insulating GaAs substrate, and gathering together the fingers of the source electrode;
   a drain terminal electrode placed on top of the first surface of the semi-insulating GaAs substrate, and gathering together the fingers of the drain electrode;
   a gate pad placed on top of the ohmic electrode layer, and connecting the ohmic electrode layer and the gate terminal electrode together; and
   a backside metal electrode placed on top of a second surface of the semi-insulating GaAs substrate opposite to the first surface, and connected to the source terminal electrode.

2. The semiconductor device of claim 1, wherein the n type semiconductor layer and the p type semiconductor layer form a pn junction.

3. The semiconductor device of claim 1, wherein the source terminal electrode and the backside metal electrode are connected to each other via a through-hole formed in the semi-insulating GaAs substrate.

4. A semiconductor device comprising:
   a semi-insulating GaAs substrate;
   a gate electrode placed on top of a first surface of the semi-insulating GaAs substrate, and including a plurality of fingers;
   a source electrode placed on top of the first surface of the semi-insulating GaAs substrate, and including a plurality of fingers;
   a drain electrode placed on top of the first surface of the semi-insulating GaAs substrate, and including a plurality of fingers;
   a plurality of gate bus lines placed on top of the first surface of the semi-insulating GaAs substrate, each gate bus line gathering together the corresponding ones of the fingers of the gate electrode;
   a source terminal electrode placed on top of the first surface of the semi-insulating GaAs substrate, and gathering together the fingers of the source electrode;
   a drain terminal electrode placed on top of the first surface of the semi-insulating GaAs substrate, and gathering together the fingers of the drain electrode;
   a plurality of gate terminals connected to the plurality of gate bus lines, respectively;
   a plurality of extraction electrodes formed between adjacent ones of the gate terminals, each extraction electrode being adjacent to the corresponding one of the gate terminal;
   a plurality of gate pads each covering the corresponding gate terminal and the extraction electrode adjacent to the corresponding gate terminal, and connecting the gate terminal to the extraction electrode;
   an n type semiconductor resistive layer formed in the semi-insulating GaAs substrate and being in contact with adjacent paired ones of the extraction electrodes;
   a p type semiconductor layer formed in the semi-insulating GaAs substrate and covering a circumference of the resistive layer including an undersurface of the resistive layer;
   an n type semiconductor layer formed in the semi-insulating GaAs substrate and covering a circumference of the p type semiconductor layer including an undersurface of the p type semiconductor layer; and
   a backside metal electrode formed on the backside of the semi-insulating GaAs substrate, and electrically connected to a connection portion of the source electrode.

5. The semiconductor device of claim 4, wherein
   the n type semiconductor layer is formed in the semi-insulating GaAs substrate,
   the p type semiconductor layer is formed in the n type semiconductor layer, and
   the resistive layer is formed in the p type semiconductor layer.

6. The semiconductor device of claim 4, wherein, when a negative voltage is applied to the gate pads with a voltage of the backside metal electrode set at 0 V, a potential barrier is formed between the p type semiconductor layer and the n type semiconductor layer.

7. The semiconductor device of claim 6, wherein, when the negative voltage is applied to the gate pads with the voltage of the backside metal electrode set at 0 V, a voltage between the p type semiconductor layer and the n type semiconductor layer is higher than a voltage between the resistive layer and the p type semiconductor layer.

* * * * *